United States Patent [19]

Sakumoto et al.

[11] Patent Number: 5,091,251

[45] Date of Patent: Feb. 25, 1992

[54] ADHESIVE TAPES AND SEMICONDUCTOR DEVICES

[75] Inventors: Yukinori Sakumoto; Shigeyuki Yokoyama; Akihiro Shibuya; Nobuyuki Nakayama; Atsushi Koshimura, all of Shizuoka, Japan

[73] Assignee: Tomoegawa Paper Co., Ltd., Japan

[21] Appl. No.: 528,203

[22] Filed: May 24, 1990

[30] Foreign Application Priority Data

| May 29, 1989 | [JP] | Japan | 1-132726 |
| Apr. 14, 1990 | [JP] | Japan | 2-98285 |
| Apr. 14, 1990 | [JP] | Japan | 2-98286 |
| Apr. 14, 1990 | [JP] | Japan | 2-98287 |

[51] Int. Cl.⁵ .......................... B32B 7/12; B32B 15/04
[52] U.S. Cl. ....................................... 428/352; 428/40; 428/344; 428/354; 428/473.5; 357/70
[58] Field of Search ............... 428/40, 344, 352, 354, 428/473.5

[56] References Cited

U.S. PATENT DOCUMENTS

| 4,666,762 | 5/1987 | Yamamoto | 428/354 X |
| 4,861,648 | 8/1989 | Kleinschmidt et al. | 428/352 X |
| 4,892,602 | 1/1990 | Oike et al. | 428/344 X |

FOREIGN PATENT DOCUMENTS

| 34085/1986 | 2/1986 | Japan . |
| 90953/1987 | 4/1987 | Japan . |
| 246851/1988 | 10/1988 | Japan . |

Primary Examiner—George F. Lesmes
Assistant Examiner—D. R. Zirker
Attorney, Agent, or Firm—Lowe, Price, Leblanc & Becker

[57] ABSTRACT

Adhesive tapes suitable for use in wire-bonded semiconductor devices are disclosed. They are each composed of a heat-resistant substrate formed of at least one layer, a copper foil provided on one side of the substrate, and a semi-cured adhesive layer and a protective film provided successively on the other side of the substrate. Semiconductor devices fabricated using such adhesive tapes are also disclosed.

18 Claims, 5 Drawing Sheets

ADHESIVE TAPES AND SEMICONDUCTOR DEVICES

BACKGROUND OF THE INVENTION

1) Field of the Invention

The present invention relates to adhesive tapes which can be bonded to substrate members such as die pads of leadframes, ceramic boards, metal plate and resin-made circuit boards and particularly, to adhesive tapes suitable for use in wire-bonded semiconductor devices. This invention is also concerned with semiconductor devices fabricated using such adhesive tapes.

2) Description of the Related Art

As is shown in FIG. 11, a semiconductor device has heretofore been fabricated by fixing a semiconductor chip 7 on a die pad 9a of a leadframe with an adhesive 10 and then wire-bonding the semiconductor chip 7 and lead pins 9b of the leadframe with gold wires 8. Along with the gold wires, the semiconductor chip thus wire-bonded is sealed with a resin.

Reflecting the ever-increasing volume of information in recent years, there is now an increasing demand for the inclusion of much more lead pins in leadframes for such semiconductor devices. On the other hand, there is another increasing demand for smaller semiconductor chips in view of the recent trend toward a higher mounting density and a lower fabrication cost. As a result, lead pins tend to become longer and accordingly, to have a smaller width and narrower intervals These lead pins are therefore required to have high accuracy at tips of inner leads.

Upon formation of a leadframe, there is however a limitation to the accuracy of its etching so that the above requirement can by no means be fulfilled. In the conventional techniques, positioning of a small chip and tips of inner leads of lead pins of a multi-pin leadframe at locations close enough to permit wire bonding leads to the problem that the tips of inner leads of the lead pins are brought into contact to one another or no leads can be formed because of the limited accuracy of etching or punching of the leadframe. To overcome this problem, it is necessary to widen the distance between the small chip and each of the tips of inner leads of the lead pins. This however results in longer distances between the semiconductor chip and the proximal tips of the individual lead pins, thereby developing the problem that gold wires connecting the semiconductor chip and the lead pins are brought into contact due to movement of the wires upon sealing the semiconductor chip and wires with a resin.

SUMMARY OF THE INVENTION

The present invention has been completed in view of the above-described problems of the conventional techniques.

An object of the present invention is therefore to provide an adhesive tape suitable for use in reliably wire-bonding a small semiconductor chip with proximal tips of a number of lead pins.

Another object of the present invention is to provide a semiconductor device which makes use of the above adhesive tape.

In one aspect of the present invention, there is thus provided an adhesive tape comprising a heat-resistant substrate formed of at least one layer, a copper foil provided on one side of the substrate, and a semi-cured adhesive layer and a protective film provided successively on the other side of the substrate.

The adhesive tape according to the present invention includes various embodiments, including the following three embodiments.

In an adhesive tape according to the first embodiment, the heat-resistant substrate comprises a heat-resistant film and an adhesive layer laminating the copper foil on the heat-resistant film. It therefore has the structure that the copper foil is laminated on one side of the heat-resistant film via the adhesive layer and the semi-cured adhesive layer and protective film are successively provided on the other side of the heat-resistant film.

In an adhesive tape according to the second embodiment, the heat-resistant base comprises a heat-resistant resin layer formed on the copper foil. It hence has the structure that the copper foil and heat-resistant resin layer is in the form of a laminate and the semi-cured adhesive layer and protective film are successively provided on a surface of the heat-resistant resin layer in the laminate.

In an adhesive tape according to the third embodiment, the heat-resistant substrate comprises a heat-resistant resin layer formed on the copper foil, an adhesive layer and a heat-resistant film. It accordingly has the structure that a laminate consisting of the copper foil and the heat-resistant resin layer formed on the copper foil is superposed on one side of the heat-resistant film with the heat-resistant resin layer facing toward the heat-resistant film and the semi-cured adhesive layer and protective film are successively provided on the other side of the heat-resistant film.

In another aspect of the present invention, there is also provided a semiconductor device fabricated using the above adhesive tape.

A semiconductor device according to one embodiment of the present invention comprises: an adhesive tape having a heat-resistant substrate formed of at least one layer, a copper foil layer provided on one side of the substrate and defining a copper foil pattern which comprises a chip mounting area and a conductive printed circuit pattern with beam type leads (hereinafter referred to as "printed leads") surrounding the chip mounting area, and a semi-cured adhesive layer provided on the other side of the substrate; a leadframe having a die pad, on which the adhesive tape is adhered, and a number of lead pins; a semiconductor chip fixed in the chip mounting area of the adhesive tape; wires applied by wire bonding between the semiconductor chip and one ends of the printed leads and between the other ends of the printed leads and the lead pins of the lead frame; and a resin sealing hermetically enclosing the semiconductor chip and wires; whereby the semiconductor chip and the corresponding lead pins are electrically connected via the corresponding printed leads formed in the copper foil layer of the adhesive tape.

A semiconductor device according to another embodiment of the present invention comprises: an adhesive tape having a heat-resistant substrate formed of at least one layer, a copper foil layer provided on one side of the substrate and defining a copper foil pattern of a number of printed leads, a semi-cured adhesive layer provided on the other side of the substrate, and centrally defining a punched-out cavity; a leadframe having a die pad, on which the adhesive tape is adhered, and a number of lead pins; a semiconductor chip fixed in the cavity of the adhesive tape; wires applied by wire bonding between the semiconductor chip and one ends of the printed leads and between the other ends of the printed leads and the lead pins of the lead frame; and a resin sealing hermetically enclosing the semiconductor chip and wires; whereby the semiconductor chip and the corresponding lead pins are electrically connected via the corresponding printed leads formed in the copper foil layer of the adhesive tape.

In the conventional semiconductor device, the semiconductor chip and the lead pins are directly connected by wire bonding. When the semiconductor chip is of a small size or many lead pins are involved, the conventional semiconductor device tends to develop the problem that tips of inner leads of the lead pins are contacted to one another or wires are mutually contacted. This problem can be solved by using the adhesive tape of this invention. In the case of the adhesive tape of this invention, a copper foil pattern can be formed by etching in the copper foil which forms a surface of the adhesive tape. Accordingly, the wire bonding between the semiconductor chip and the lead pins is applied in two stages by way of the copper foil pattern thus formed. As a result, the defect of mutual contact of wires has overcome because wires are shorter. Further, the copper foil pattern has been formed in a fixed state, thereby making it possible to reliably applying wire bonding.

The adhesive tape of the present invention can be applied not only to die pads of leadframes but also to other base members such as ceramic boards, metal plates and resin-made circuit boards.

DETAILED DESCRIPTION OF PREFERRED EMBODIMENTS

Certain adhesive tapes according to the present invention will hereinafter be described with reference to the accompanying drawings.

Figure 1:
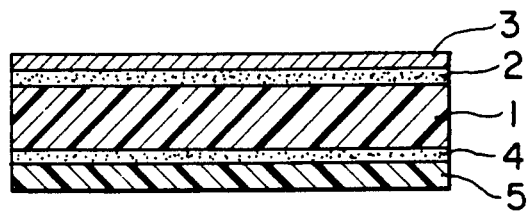
FIGS. 1 through 3 are cross-sectional views of adhesive tapes according to various embodiments of the present invention.
Figure 2:
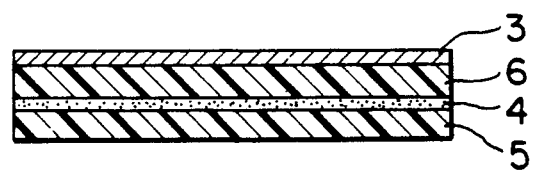
Figure 3:
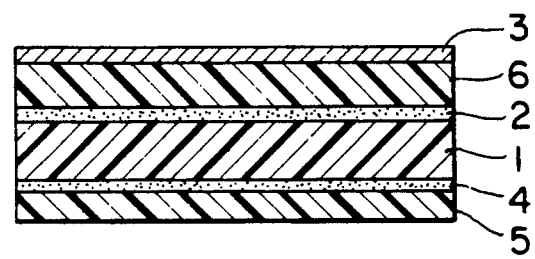

FIGS. 1 through 3 are cross-sectional views of adhesive tapes according to first to third embodiments of the present invention, respectively. FIG. 1 depicts a heat-resistant substrate which is formed of a heat-resistant film 1 and an adhesive layer 2 for laminating a copper foil 3. FIG. 2 illustrates another heat-resistant substrate which is constructed of a heat-resistant resin layer 6 formed on a copper foil 3. FIG. 3 shows a further heat-resistant substrate which is composed of a heat-resistant resin layer 6 formed on a copper foil 3, an adhesive layer 2 and a heat-resistant film 1.

In FIG. 1, the copper foil 3 is laminated on one side of the heat-resistant film 1. On the other side of the heat-resistant film 1, a semi-cured adhesive layer 4 and a protective film 5 are provided successively.

Referring next to FIG. 2, the heat-resistant resin layer 6 has been formed on the copper foil 3 by cast coating or extrusion. A semi-cured adhesive layer 4 and a protective film 5 are successively provided on a surface of the heat-resistant resin layer 6. The adhesive tape of the structure shown in FIG. 2 allows to reduce the production cost since it permits the use of cast coating or extrusion, and has another merit that it does not require a heat-resistant adhesive layer having a high glass transition temperature (Tg).

In FIG. 3, a laminate which consists of the copper foil 3 and the heat-resistant resin layer 6 formed on the copper foil 3 by cast coating is laminated on one side of the heat-resistant film 1 via the adhesive layer 2. Further, a semi-cured adhesive layer 4 and a protective film 5 are successively provided on the other side of the heat-resistant film 1. The structure depicted in FIG. 3 can be applied preferably where the thickness of the heat-resistant resin layer formed by cast coating is too thin to easily permit further work.

A description will next be made of materials which make up each layer of the adhesive tape according to the present invention.

(Copper foil)

A rolled or electrolytic copper or alloyed copper foil having a basis weight less than 3 ounces (the weight of the copper foil per square feet; the same definition will hereinafter be applied), preferably of 1 ounce or less is used. In some instances, the copper foil may be subjected to chromate treatment at the front side thereof to inhibit oxidation and to Zn, Ni or like plating at the back side thereof to prevent diffusion of copper from the back side of copper foil to the adjacent layer.

(Adhesive layer)

Exemplary adhesives usable to form the adhesive layer include polyimide adhesives, epoxy/polyamide adhesives, polyamideimide adhesives, epoxy adhesives, and polyester adhesives; as well as NBR/phenol adhesives, polyamide adhesives, polybutyral/phenol adhesives, and their epoxy-modified adhesives. Polyimide adhesives include addition polyimides and condensation polyimides, which have a glass transition temperature (Tg) of at least 160° C. and contain imide rings in their molecules or form imide rings upon condensation. The adhesive layer can be formed by coating one of these adhesives on one side of a heat-resistant film or on a surface of a copper foil or a surface of a heat-resistant resin layer to give a dry coat thickness of 5-50 μm, preferably less than 20 μm and after drying, completely curing the coat in a laminated state. By the adhesive layer, the heat-resistant film and the copper film or heat-resistant resin layer are bonded together.

Typical polyimide adhesives include polyamic acids having monomer units capable of forming imide rings through polycondensation and represented by the following structural formula (for example, "LARK-TPI", trade name):

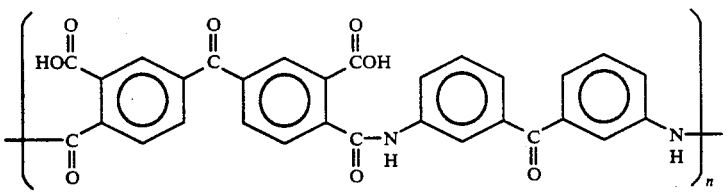

and polyimides having acetylene groups at both ends (for example, "MC-600", "IP-6001", "IP-630" and "FA7001", all trade names).

(Heat-resistant film)

Illustrative of the heat-resistant film include heat-resistant films such as polyimide films, polyetherimide films, polyphenylene sulfide films and polyetheretherketone films; and composite heat-resistant films such as epoxy resin-glass cloth films and epoxy resin-polyimide-glass cloth films, all of which have a thickness of 10–150 μm, preferably 25–75 μm. To enhance the adhesion strength to the adjacent layer, corona discharge treatment or plasma treatment can be applied to the heat-resistant film.

(Heat-resistant resin layer)

The heat-resistant resin layer is formed by cast coating or extrusion on the copper foil. Exemplary heat-resistant resins suited for cast coating include polyimide resins, epoxy resins, polyamideimide resins, and the like. It is preferable to use, for example, an adhesive composed mainly of a varnish of a polyimide which has the Kapton-type molecular structure and a relatively high Tg (160° C. or up). The heat-resistant resin layer can also be formed by extrusion instead of cast coating. For extrusion, polyphenylene sulfide resins, polyetheretherketone resins, polyetherimide resins, polyamideimide resins and the like can be used.

(Semi-cured adhesive layer)

The semi-cured adhesive layer can be formed by coating a polyimide, polyimide/polyamide or epoxy adhesive, which may contain a filler.

In the present invention, it is essential that the adhesive layer formed by coating such an adhesive is in a semi-cured state of the B stage.

It is generally preferred to control the thickness of the semi-cured adhesive layer within a range of 5–50 μm.

(Protective film)

Exemplary protective films include polyethylene terephthalate films, polypropylene films and fluoroplastic films, which have a thickness of 20–100 μm and are imparted with release properties by a silicone resin or the like; as well as paper sheets treated with a releasing agent. The protective film is supposed to stick with the above-described semi-cured adhesive layer but to be easily peeled off from the semi-cured adhesive layer.

In each adhesive tape of the present invention, at least one of the adhesive layer, heat-resistant resin layer and semi-cured adhesive layer may preferably contain:

(1) at least one filler selected from silica, alumina, zirconia and silicon nitride; or (2) at least one silane coupling agent selected from compounds represented by the following formula (I):

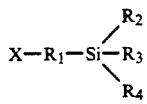

wherein X means $CH_2=CH-$ or

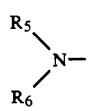

in which $R_5$ and $R_6$ are each $H-$ or $NH_2CH_2CH_2-$, $R_1$ denotes $-C_nH_{2n}-$ in which n stands for an integer of 0–5, and $R_2$, $R_3$ and $R_4$ individually represent a group selected from $-CH_3$, $-OCH_3$, $-OCH_2CH_3$ and $-OCH_2CH_2OCH_3$.

The inclusion of the filler or silane coupling agent described above makes it possible to lower the water absorption of the adhesive tape, whereby occurrence of package cracking can be prevented without lowering its electrical conductivity. It is therefore possible to avoid the problem that in a severe high-temperature atmosphere upon fabrication of a semiconductor package or during a solder dipping step, water is caused to evaporate to induce a sort of explosion phenomenon and package cracking takes place.

In the present invention, it is particularly preferred to include the filler or silane coupling agent in the heat-resistant resin layer.

The particle size of the filler is less than 20 μm, preferably less than 10 μm to enhance the adhesion strength between the copper foil and another layer.

The content of the filler is preferably in a range of 1–50 parts by weight per 100 parts by weight of the resin, with a range of 1–30 parts by weight being particularly preferred. If the content of the filler is smaller than 1 part by weight per 100 parts by weight of the resin, the reduction of the water absorption is not sufficient. On the other hand, filler contents greater than 50 parts by weight lead to a lower adhesion with the copper foil and the other layer. It is therefore not preferred to contain the filler in any amount outside the above range.

Specific examples of the silane coupling agent selected from the compounds represented by the formula (I) and usable in the present invention include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane and 3-aminopropyltriethoxysilane.

The content of such a silane coupling agent is preferably in a range of 0.01–30 parts by weight per 100 parts by weight of the resin. If the content of the silane coupling agent becomes smaller than 0.01 part by weight per 100 parts by weight of the resin, the water absorption cannot be lowered sufficiently. If it exceeds 30 parts by weight, mechanical properties of the layer are deleteriously affected. It is therefore not preferred to contain the silane coupling agent in any amount outside the above range.

A description will next be made of some semiconductor devices each of which makes use of an adhesive tape of the present invention. Any one of the adhesive tapes of FIGS. 1 through 3 can be used for the fabrication of these semiconductor devices. To avoid repetition of the description, these semiconductor devices will hereinafter be described assuming by way of example that their adhesive tapes have the structure shown in FIG. 1.

Figure 4B:
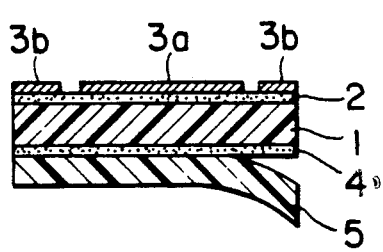
FIG. 4(b) is a cross-sectional view of the tape piece, taken in the direction of arrows IV(b)-IV(b) of FIG. 4(a)
Figure 4A:
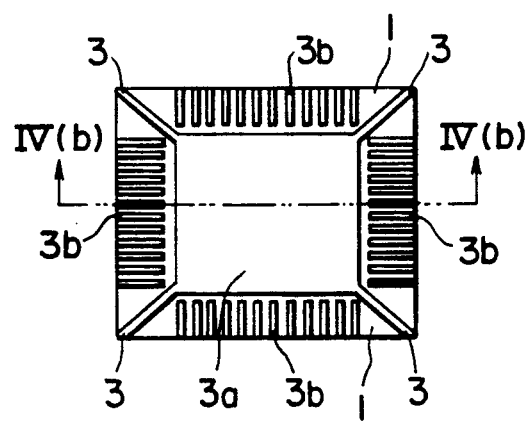
FIG. 4(a) is a plan view of a piece of an adhesive tape, said piece having a copper foil pattern formed on a surface thereof.

A copper foil of an adhesive tape having the structure depicted in FIG. 1 is subjected to etching treatment to form a desired copper foil pattern. The copper foil pattern is then plated with nickel or gold and then punched into a predetermined size suitable for bonding on a die pad of a leadframe, whereby an adhesive tape piece having the copper foil pattern is formed as illustrated in FIGS. 4(a) and 4(b). FIG. 4(a) is a plan view, while FIG. 4(b) is a cross-sectional view. In these drawings, 1–5 indicate like elements of structure, 3a indicates a chip mounting area formed in the copper foil layer and adapted to mount a semiconductor chip thereon, and 3b designates printed leads.

Figure 5:
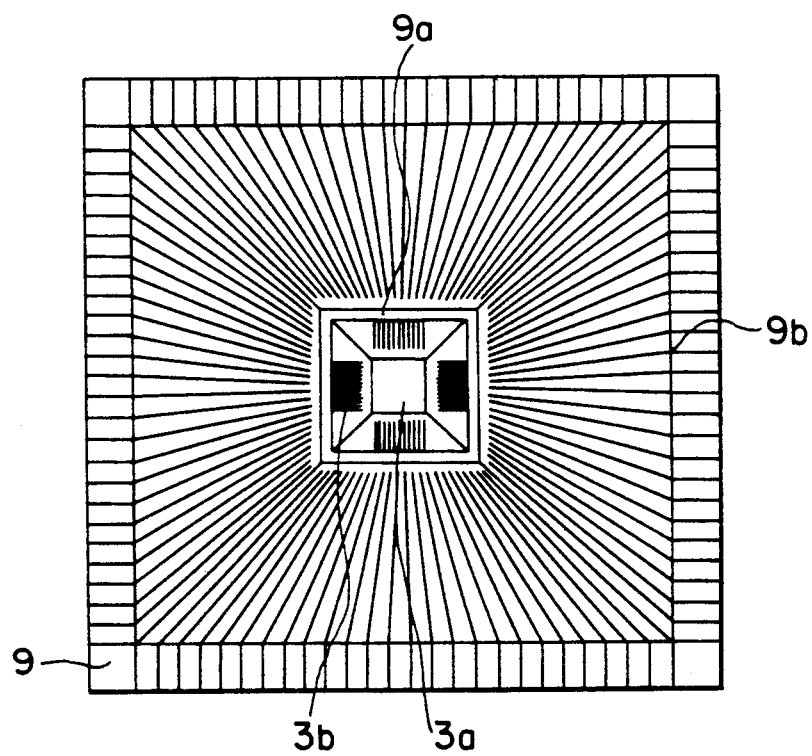
FIG. 5 is a plan view showing the tape piece of FIG. 4 bonded on a leadframe.

After the protective film 5 is peeled off, the adhesive tape piece is placed on the die pad of the leadframe and the semi-cured adhesive layer is heated and cured, so that the adhesive tape piece is bonded to the die pad. FIG. 5 is a plan view showing this state. In the drawing, there are shown the chip mounting area 3a for mounting a semiconductor chip thereon, the printed leads 3b, the leadframe 9, the die pad 9a, and the lead pins 9b.

Next, the semiconductor chip is bonded with an adhesive paste on the chip mounting area 3a of the copper foil pattern, and wire bonding is then applied using gold wires.

EXAMPLES

Semiconductor devices according to preferred embodiments will next be described with reference to some of the accompanying drawings.

Figure 6:
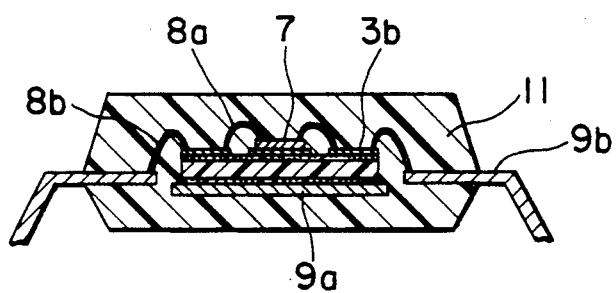
FIG. 6 is a schematic cross-sectional view of a semiconductor device according to one embodiment of the present invention.
Figure 7:
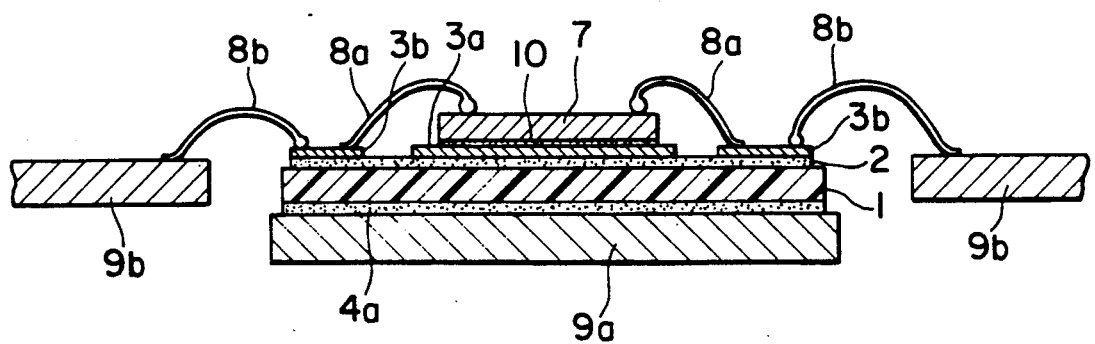
FIG. 7 is a fragmentary cross-sectional view of the semiconductor device of FIG. 6.

FIG. 6 is a cross-sectional view of a semiconductor device according to one embodiment of this invention, and FIG. 7 is a fragmentary cross-sectional view of the semiconductor device.

In FIG. 6, the adhesive tape piece shown in FIG. 4, which has the copper foil pattern formed thereon, is placed on a die pad 9a of a leadframe and is bonded to the die pad 9a with a semi-cured adhesive layer. The layer 4a is an adhesive layer formed as a result of curing of the semi-cured adhesive layer. A semiconductor chip 7 is bonded with an adhesive 10 on the chip mounting area 3a of the copper foil pattern. Wire bonding has been applied with gold wires 8a,8b between the semiconductor chip 7 and printed leads 3b of the copper foil pattern and between the printed leads 3b of the copper foil pattern and corresponding lead pins 9b of a leadframe. Accordingly, the semiconductor chip 7 and the lead pins 9b are electrically connected to each other via the printed leads 3b formed in the copper foil layer of the adhesive tape. The molding area of the leadframe including the semiconductor chip, gold wires and inner lead pins, etc. are hermetically sealed with a resin 11.

Figure 8:
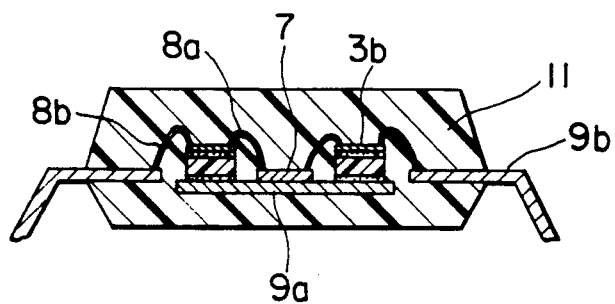
FIG. 8 is a schematic cross-sectional view of a semiconductor device according to another embodiment of the present invention.
Figure 9:
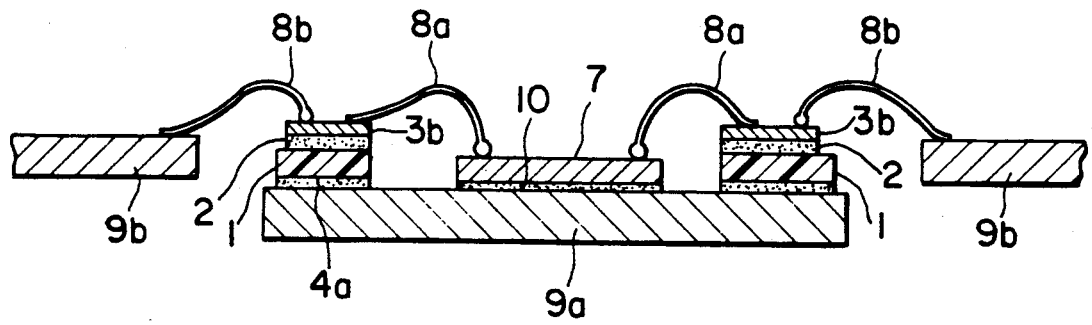
FIG. 9 is a fragmentary cross-sectional view of the semiconductor device of FIG. 8.

FIG. 8 is a cross-sectional view of a semiconductor device according to another embodiment of this invention, and FIG. 9 is a fragmentary cross-sectional view of the semiconductor device.

In FIG. 8, the chip mounting area 3a of the copper foil of FIG. 4 has been punched out into a cavity. A semiconductor chip 7 is directly bonded on a die pad 9a with an adhesive 10. Wire bonding has been applied with gold wires 8a,8b between the semiconductor chip 7 and printed leads 3b of the copper foil pattern and between the printed leads 3b of the copper foil pattern and corresponding lead pins 9b of a leadframe. Accordingly, the semiconductor chip 7 and the lead pins 9b are electrically connected to each other via the printed leads 3b formed in the copper foil layer of the adhesive tape. The molding area of the leadframe including the semiconductor chip, gold wires and inner lead pins, etc. are hermetically sealed with a resin 11.

The embodiments of FIGS. 6 to 9 have been described using the adhesive tape shown in FIG. 1. When the adhesive tape shown in FIG. 2 or FIG. 3 is used, semiconductor devices can also be fabricated in a similar manner.

The adhesive tape of the present invention will hereinafter be described specifically by the following examples.

EXAMPLE 1

An electrolytic copper foil having a basis weight of 1 ounce (product of Nippon Mining Co., Ltd.) was coated with a polyimide resin ("Thermid IP-630", trade name, product of NSC-Kanebo Co., Ltd.; dimethylacetamide coating formulation of 20% solid concentration) to a coat thickness of 15 $\mu$m. The thus-coated copper foil was heated and dried at 120° C. for 5 minutes, whereby an adhesive layer was formed.

To the surface of the adhesive layer thus formed, a heat-resistant film formed of a polyimide film ("Kapton 500V", trade name; product of Du Pont-Toray Co., Ltd.) was bonded at 120° C. and 1 m/min through laminating rolls. The resulting laminate was heated further at 160° C. for 5 hours to cure the adhesive layer.

An adhesive composed of an epoxy/polyamide resin ("S-dain 3611", trade name; product of Sekisui Chemical Co., Ltd.) was coated to a thickness of 20 $\mu$m on the surface of the heat-resistant film, followed by heating at 150° C. for 5 minutes to provide a semi-cured adhesive layer.

Further, a protective film formed of a 38 $\mu$m thick polyethylene terephthalate film was bonded to the surface of the semi-cured adhesive layer thus formed, whereby an adhesive tape of the structure shown in FIG. 1 was produced.

EXAMPLE 2

A rolled copper foil having a basis weight of 1 ounce (product of Nippon Mining Co., Ltd.) was cast-coated with an N-methylpyrrolidone coating formulation of a heat-resistant polyimide resin ("Thermid IP-630", trade name; product of NSC-Kanebo Co., Ltd.). The solid concentration of the coating formulation was 20%. The coated layer was heated and cured at 200° C. for 1 hour, whereby a 30 $\mu$m thick heat-resistant resin layer was formed on one side of the copper foil.

On the surface of the heat-resistant resin layer, an adhesive composed of an epoxy/polyamide resin ("S-dain 3611", trade name; product of Sekisui Chemical Co., Ltd.) was coated to a thickness of 20 $\mu$m, followed by heating at 150° C. for 5 minutes to provide a semi-cured adhesive layer.

Further, a protective film formed of a 38 μm thick polyethylene terephthalate film was bonded to the surface of the semi-cured adhesive layer thus formed, whereby an adhesive tape of the structure shown in FIG. 2 was produced.

EXAMPLE 3

A rolled copper foil having a basis weight of 1 ounce (product of Nippon Mining Co., Ltd.) was cast-coated with an N-methylpyrrolidone coating formulation of a heat-resistant polyimide resin ("Thermid IP-630", trade name; product of NSC-Kanebo Co., Ltd.). The solid concentration of the coating formulation was 20%. The coated layer was heated and cured at 200° C. for 1 hour, whereby a 30 μm thick heat-resistant resin layer was formed on one side of the copper foil.

On the surface of the heat-resistant resin layer, an adhesive composed of an epoxy/polyamide resin ("S-dain 3611", trade name; product of Sekisui Chemical Co., Ltd.) was coated to a thickness of 10 μm, followed by heating at 160° C. for 2 hours to cure the adhesive layer.

Thereafter, an adhesive composed of the same epoxy/polyamide resin as the one employed above was coated to a thickness of 30 μm on the surface of the heat-resistant film, followed by heating at 150° C. for 5 minutes to provide a semi-cured adhesive layer.

A protective film formed of a 38 μm thick polyethylene terephthalate film was next bonded to the surface of the semi-cured adhesive layer thus formed, whereby an adhesive tape of the structure shown in FIG. 3 was produced.

Using each of the adhesive tapes of the present invention produced above in Examples 1-3 respectively, the copper foil was etched by a method known per se in the art to form a copper foil pattern. After the copper foil pattern was plated with Ni and gold, punching was applied so that an adhesive tape piece of the shape depicted in FIG. 4 was obtained. After the protective film was peeled off, the adhesive tape piece was bonded on a die pad of a leadframe as illustrated in FIG. 6. During the process of those fabrications, the etching, the resistance to plating agents, punching, and the attaching to the die pad was performed successfully.

A semiconductor chip was bonded to the central copper foil pattern of the adhesive tape piece, whereby the semiconductor chip was mounted there. Using ultrasonic waves, wire bonding was then applied at 250° C. (see FIG. 6).

Figure 10:
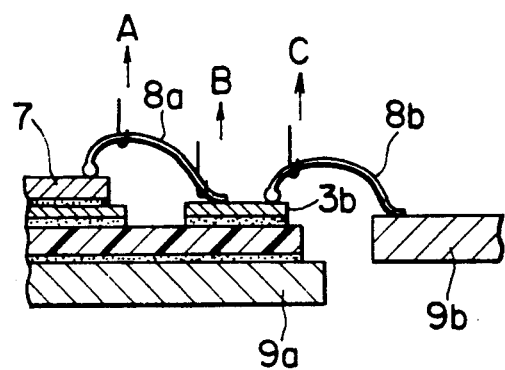
FIG. 10 is a schematic illustration showing a position where the adhesion bonding strength of wire bonding is to be measured.
Figure 11:
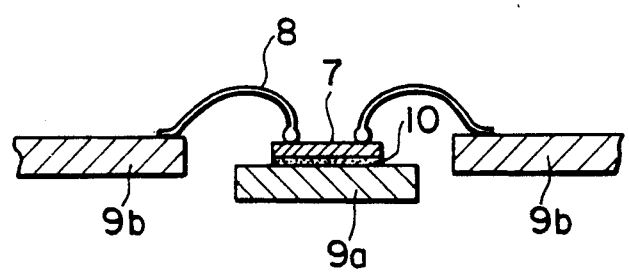
FIG. 11 is a schematic illustration showing the state of wire bonding applied in a conventional semiconductor device.

With respect to each of the semiconductor devices fabricated as described above, the state of wire bonding was investigated. Namely, the adhesion strengths at three points A, B and C shown in FIG. 10 were measured by a wire bonding tester. As a result, all the adhesive tapes were confirmed to provide sufficient adhesion strength as shown below in Table 1.

TABLE 1

|   | Example 1 | Example 2 | Example 3 |
|---|-----------|-----------|-----------|
| A | 8 g/wire  | 9 g/wire  | 10 g/wire |
| B | 5 g/wire  | 7 g/wire  | 7 g/wire  |
| C | 6 g/wire  | 7 g/wire  | 8 g/wire  |

As a result of an X-ray analysis, resin moldings applied after the wire bonding were found to include no problem. It was therefore confirmed that those adhesive tapes had sufficient reliability as elements of semiconductor devices.

EXAMPLE 4

An electrolytic copper foil having a basis weight of 1 ounce (product of Nippon Mining Co., Ltd.) was cast-coated with a heat-resistant resin coating formulation. Namely, a 30 μm thick heat-resistant resin layer was formed on one side of the copper foil by using as the heat-resistant resin coating formulation an N-methylpyrrolidone coating formulation of a mixture, which consisted of 100 parts by weight of a heat-resistant polyimide resin ("Thermid IP-630", trade name; product of NSC-Kanebo Co., Ltd.) and 25 parts by weight of silica ("P-527D", trade name; product of Mizusawa Industrial Chemicals, Ltd.), and heating and after coating, heating and curing the coat at 150° C. for 1 hour, at 200° C. for 1 hour and then at 300° C. for 20 minutes. The solid concentration of the N-methylpyrrolidone coating formulation was 20%.

An adhesive formed of an epoxy/polyamide resin ("S-dain 3611", trade name; product of Sekisui Chemical Co., Ltd.) was coated to a thickness of 10 μm on the surface of the heat-resistant resin layer. After the adhesive was dried, a heat-resistant film made of a polyimide resin ("Upilex 75SS", trade name; product of Ube Industries, Ltd.) was bonded. The resultant laminate was heated at 160° C. for 2 hours to cure the adhesive layer. On the surface of the heat-resistant film, an adhesive composed of the same epoxy/polyamide resin as that employed above was coated to give a thickness of 30 μm, followed by heating at 150° C. for 5 minutes to provide a semi-cured adhesive layer. A protective film formed of a 38 μm thick polyethylene terephthalate film was next bonded to the surface of the semi-cured adhesive layer thus formed, whereby an adhesive tape of the structure shown in FIG. 3 was produced.

EXAMPLE 5

An adhesive tape was produced in a similar manner to Example 4 except that in the heat-resistant resin coating formulation of Example 4, 25 parts by weight of zirconia ("FZ", trade name; product of Tateho Chemical Industries Co., Ltd.) were added in place of 25 parts by weight of silica.

EXAMPLE 6

An adhesive tape was produced in a similar manner to Example 4 except that in the heat-resistant resin coating formulation of Example 4, 25 parts by weight of silicon nitride (fine powdery product; product of Asahi Glass Co., Ltd.) were added in place of 25 parts by weight of silica.

EXAMPLE 7

An adhesive tape was produced in a similar manner to Example 4 except that in the heat-resistant resin coating formulation of Example 4, 25 parts by weight of alumina ("AL15A", trade name; product of Showa Denko K. K.) were added in place of 25 parts by weight of silica.

EXAMPLE 8

An electrolytic copper foil having a basis weight of 1 ounce (product of Nippon Mining Co., Ltd.) was cast-coated with a heat-resistant resin coating formulation. Used as the heat-resistant resin coating formulation was an N-methylpyrrolidone coating formulation of a mixture, which consisted of 100 parts by weight of a heat-resistant polyimide resin ("Thermid IP-630", trade name; product of NSC-Kanebo Co., Ltd.) and 1 part by weight of a silane coupling agent composed of the compound represented by the following structural formula:

$$H_2NCH_2CH_2NHCH_2CH_2CH_2Si(OCH_3)_2 \text{ with } CH_3$$

("Sairaeisu S-310", trade name; product of Chisso Corporation). The solid concentration of the N-methylpyrrolidone coating formulation was 20%. After the coating, the coated coating formulation was heated and cured at 150° C. for 1 hour, at 200° C. for 1 hour and then at 300° C. for 20 minutes, whereby a 30 μm thick heat-resistant resin layer was formed on one side of the copper foil.

The procedure of Example 4 was then followed to produce an adhesive tape.

EXAMPLE 9

An adhesive tape was produced in a similar manner to Example 8 except for the use of a heat-resistant resin coating formulation obtained by adding 1 part by weight of a silane coupling agent composed of the compound represented by the following structural formula: $CH_2=CHSi(OCH_2CH_2OCH_3)_3$ ("Sairaeisu S-230", trade name; product of Chisso Corporation) instead of the silane coupling agent in the heat-resistant resin coating formulation in Example 8.

EXAMPLE 10

An adhesive tape was produced in a similar manner to Example 8 except for the use of a heat-resistant resin coating formulation obtained by adding 1 part by weight of a silane coupling agent composed of the compound represented by the following structural formula:

$$H_2NCH_2CH_2Si(OCH_2CH_3)_3$$

("Sairaeisu S-330", trade name; product of Chisso Corporation) instead of the silane coupling agent in the heat-resistant resin coating formulation in Example 8.

EXAMPLE 11

An electrolytic copper foil having a basis weight of 1 ounce (product of Nippon Mining Co., Ltd.) was coated with a dimethylacetamide coating formulation of a mixture, which consisted of 100 parts by weight of a polyamideimide adhesive ("TORLON", trade mark; product of Amoco Corporation) and 25 parts by weight of silica ("P-527D", trade name; product of Mizusawa Industrial Chemicals, Ltd.), to give a coat thickness of 15 μm. The solid concentration of the dimethylacetamide coating formulation was 25%. The copper foil thus coated was heated and dried at 120° C. for 5 minutes, whereby an adhesive layer was provided.

To the surface of the adhesive layer thus formed, a heat-resistant film formed of a polyimide resin ("Upilex 75SS", trade name) was bonded at 120° C. and 1 m/min through laminating rolls. The resulting laminate was heated further at 160° C. for 5 hours to cure the adhesive layer.

An IPA/toluene coating formulation of a mixture, which consisted of 100 parts by weight of an epoxy/polyamide resin ("S-dain 3611", trade name; product of Sekisui Chemical Co., Ltd.) and 25 parts by weight of silica ("P-527D", trade name; product of Mizusawa Industrial Chemicals, Ltd.), was then coated to a thickness of 20 μm on the surface of the heat-resistant film. The solid concentration of the coating formulation was 25%. The resultant laminate was heated at 150° C. for 5 minutes so that a semi-cured adhesive layer was provided.

Further, a protective film formed of a 38 μm thick polyethylene terephthalate film was bonded to the surface of the semi-cured adhesive layer thus formed, whereby an adhesive tape of the structure shown in FIG. 1 was produced.

EXAMPLE 12

An electrolytic copper foil having a basis weight of 1 ounce (product of Nippon Mining Co., Ltd.) was cast-coated with a dimethylacetamide coating formulation of a mixture, which consisted of 100 parts by weight of a heat-resistant polyimide resin ("Thermid IP-630", trade mark; product of NSC-Kanebo Co., Ltd.) and 25 parts by weight of silica ("P-527D", trade name; product of Mizusawa Industrial Chemicals, Ltd.), to give a thickness of 30 μm. The solid concentration of the dimethylacetamide coating formulation was 25%. The copper foil thus coated was heated and dried at 200° C. for 1 hour, whereby a heat-resistant resin layer was formed on one side of the copper foil.

To the surface of the heat-resistant resin layer thus formed, an IPA/toluene coating formulation of a mixture, which consisted of 100 parts by weight of an epoxy/polyamide resin ("S-dain 3611", trade name; product of Sekisui Chemical Co., Ltd.) and 25 parts by weight of silica ("P-527D", trade name; product of Mizusawa Industrial Chemicals, Ltd.), was then coated to a thickness of 20 μm. The solid concentration of the coating formulation was 25%. The resultant laminate was heated at 150° C. for 5 minutes so that a semi-cured adhesive layer was provided.

Further, a protective film formed of a 38 μm thick polyethylene terephthalate film was bonded to the surface of the semi-cured adhesive layer thus formed, whereby an adhesive tape of the structure shown in FIG. 2 was produced.

EXAMPLE 13

An electrolytic copper foil having a basis weight of 1 ounce (product of Nippon Mining Co., Ltd.) was coated with a dimethylacetamide coating formulation of a mixture, which consisted of 100 parts by weight of a polyamideimide adhesive ("TORLON", trade mark; product of Amoco Corporation) and 1 part by weight of a silane coupling agent composed of the compound represented by the following structural formula:

$$H_2NCH_2CH_2NHCH_2CH_2CH_2Si(OCH_3)_2 \text{ with } CH_3$$

("Sairaeisu S-310", trade name; product of Chisso Corporation), to give a coat thickness of 15 μm. The solid concentration of the coating formulation was 20%. The copper foil thus coated was heated and dried at 120° C. for 5 minutes, whereby an adhesive layer was provided.

To the surface of the adhesive layer thus formed, a heat-resistant film formed of a polyimide resin ("Upilex 75SS", trade name) was bonded at 120° C. and 1 m/min through laminating rolls. The resulting laminate was heated further at 160° C. for 5 hours to cure the adhesive layer.

To the surface of the heat-resistant film, an IPA/toluene coating formulation of a mixture, which consisted of 100 parts by weight of an epoxy/polyamide resin ("S-dain 3611", trade name; product of Sekisui Chemical Co., Ltd.) and 1 part by weight of a silane coupling agent ("Sairaeisu S-310", trade name; product of Chisso Corporation), was then coated to a thickness of 20 μm. The solid concentration of the coating formulation was 20%. The resultant laminate was heated at 150° C. for 5 minutes so that a semi-cured adhesive layer was provided.

Further, a protective film formed of a 38 μm thick polyethylene terephthalate film was bonded to the surface of the semi-cured adhesive layer thus formed, whereby an adhesive tape of the structure shown in FIG. 1 was produced.

EXAMPLE 14

An electrolytic copper foil having a basis weight of 1 ounce (product of Nippon Mining Co., Ltd.) was cast-coated with a dimethylacetamide coating formulation of a mixture, which consisted of 100 parts by weight of a heat-resistant polyimide resin ("Thermid IP-630", trade name; product of NSC-Kanebo Co., Ltd.) and 1 part by weight of a silane coupling agent composed of the compound represented by the following structural formula:

("Sairaeisu S-310", trade name; product of Chisso Corporation). The solid concentration of the coating formulation was 20%. The copper foil thus coated was heated and dried at 200° C. for 1 hour, whereby a 30 μm thick heat-resistant resin layer was formed on one side of the copper foil.

To the surface of the heat-resistant resin layer thus formed, an IPA/toluene coating formulation of a mixture, which consisted of 100 parts by weight of an epoxy/polyamide resin ("S-dain 3611", trade name; product of Sekisui Chemical Co., Ltd.) and 1 part by weight of a silane coupling agent ("Sairaeisu S-310", trade name; product of Chisso Corporation), was then coated to a thickness of 20 μm. The solid concentration of the coating formulation was 20%. The resultant laminate was heated at 150° C. for 5 minutes so that a semi-cured adhesive layer was provided.

Further, a protective film formed of a 38 μm thick polyethylene terephthalate film was bonded to the surface of the semi-cured adhesive layer thus formed, whereby an adhesive tape of the structure shown in FIG. 2 was produced.

Using each of the adhesive tapes of the present invention produced above in Examples 4-14 respectively, the copper foil was etched by a method known er se in the art to form a copper foil pattern. After the copper foil pattern was plated with Ni and gold, punching was applied so that an adhesive tape piece of the shape depicted in FIG. 4 was obtained. After the protective film was peeled off, the adhesive tape piece was bonded on a die pad of a leadframe as illustrated in FIG. 6. During the process of those fabrications, the etching, the resistance to plating agents, punching, and the attaching to the die pad was performed successfully.

A semiconductor chip was bonded to the central copper foil pattern of the adhesive tape piece, whereby the semiconductor chip was mounted there. Using ultrasonic waves, wire bonding was then applied at 250° C. (see FIG. 6).

With respect to the semiconductor devices fabricated as described above, the state of wire bonding was investigated. All the semiconductor devices had good wire bonding. Further, resin moldings applied after the wire bonding were found to include no problem.

A pressure cooker test (PCT) was then conducted on the resin-molded semiconductor packages. As an accelerated test for the determination of durability of the semiconductor packages at elevated temperatures, the resin-molded semiconductor packages were treated for 50 hours under the conditions of 121° C./2 atm by a saturated PCT testing machine. Thereafter, the semiconductor packages were dipped for 30 seconds in a solder bath of 240° C. The molding resin was removed from the semiconductor packages, and the adhesive tape pieces were observed to determine whether delamination had been developed or not. Thirty samples were tested per example. The results are summarized in Table 2.

The following test was next conducted to evaluate the degrees of aqueous ions of the fillers, i.e., the degrees of dissociation of the fillers into ions during the PCT test of the adhesive tapes of the present invention. Pieces of 38 μm thick polyethylene terephthalate films were coated with the heat-resistant resin coating formulations employed above in Examples 4-10, 12 and 14 and the coating formulations employed to form the adhesive layers in Examples 11 and 13, respectively to give a coat thickness of 50 μm. The film pieces thus coated were dried at 150° C. for 1 hour, and the pieces of the polyethylene terephthalate film were peeled off. The remaining coating layers were heated and cured at 200° C. for 1 hour and then at 300° C. for 20 minutes, whereby coating films formed solely of a heat-resistant resin layer or an adhesive layer were obtained as samples. The electrical conductivities of the samples thus obtained were measured in the following manner.

(a) Each sample was cut into about 1 cm square pieces.

(b) Ten grams of the thus-cut sample were placed in a heat-resistant round bottom flask which had been thoroughly washed, followed by the addition of 100 g of deionized water whose electrical conductivity was not higher than 5 μs/cm. A thoroughly-washed reflux condenser was fitted to the flask. The contents were heated to 100°.C. and were then left over for 20 hours.

(c) The electrical conductivity of the resulting extract was measured by a conductometer.

The results are also shown in Table 2.

TABLE 2

| | Delamination* | Electrical conductivity (μs/cm) |
|---|---|---|
| Example 4 | 0/30 | 35 |
| Example 5 | 0/30 | 30 |
| Example 6 | 0/30 | 25 |
| Example 7 | 0/30 | 35 |
| Example 8 | 0/30 | 30 |
| Example 9 | 0/30 | 30 |
| Example 10 | 0/30 | 35 |
| Example 11 | 0/30 | 35 |
| Example 12 | 0/30 | 35 |
| Example 13 | 0/30 | 30 |

TABLE 2-continued

| | Delamination* | Electrical conductivity ($\mu$s/cm) |
|---|---|---|
| Example 14 | 0/30 | 30 |

*Number of samples with delamination/number of samples measured.

What is claimed is:

1. An adhesive tape which consists essentially of a heat-resistant substrate consisting of a heat-resistant adhesive layer and a heat-resistant film, a copper foil provided on the heat-resistant adhesive layer of the substrate, and a B-stage cured heat-resistant resin adhesive layer and a removable protective film provided successively on the other side of the heat-resistant film.

2. The adhesive tape of claim 1, wherein at least one of the heat-resistant adhesive layer and the B-stage cured heat-resistant resin adhesive layer comprises a heat-resistant resin and per 100 parts by weight of the resin, 1-50 parts by weight of at least one filler selected from the group consisting of silica, alumina, zirconia and silicon nitride.

3. The adhesive tape of claim 1, wherein at least one of the heat-resistant adhesive layer and the B-stage cured heat-resistant adhesive layer comprises a resin and per 100 parts by weight of the heat-resistant resin, 0.01-30 parts of weight of at least one silane coupling agent selected from compounds represented by the following formula (I):

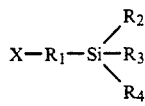

wherein X means $CH_2=CH-$ or

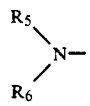

in which $R_5$ and $R_6$ are each $H-$ or $NH_2CH_2CH_2-$, $R_1$ denotes $-C_nH_{2n}$ in which n stands for an integer of 0-5, and $R_2$, $R_3$ and $R_4$ individually represent a group selected from the group consisting of $-CH_3$, $-OCH_2CH_3$ and $-OCH_2CH_2CH_3$.

4. The adhesive tape of claim 1, wherein the adhesive tape is suitable for use in wire-bonding a semiconductor device.

5. The adhesive tape of claim 1, wherein the B-stage cured heat-resistant resin adhesive layer comprises a heat-resistant resin and per 100 parts by weight of the resin, 1-50 parts by weight of at least one filler selected from the group consisting of silica, alumina, zirconia and silicon nitride.

6. The adhesive tape of claim 1, wherein the B-stage cured heat-resistant resin adhesive layer comprises a heat-resistant resin and per 100 parts by weight of the resin, 0.01-30 parts by weight of at least one silane coupling agent selected from the compounds represented by the following formula:

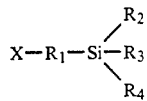

wherein X means $CH_2=CH-$ or

in which $R_5$ and $R_6$ are each $H-$ or $NH_2CH_2CH_2-$, $R_1$ denotes $-C_nH_{2n}$ in which n stands for an integer of 0-5, and $R_2$, $R_3$ and $R_4$ individually represent a group selected from the group consisting of $-CH_3$, $-OCH_3$, $-OCH_2CH_2CH_3$.

7. An adhesive tape which consists essentially of a heat-resistant substrate consisting of a heat-resistant resin layer, a copper foil provided on one side of the substrate, and a B-stage cured heat-resistant resin adhesive layer and a removable protective film provided successively on the other side of the substrate.

8. The adhesive tape of claim 7 wherein at least one of the heat-resistant resin layer and the B-stage cured heat-resistant adhesive resin layer comprises a heat-resistant resin and per 100 parts by weight of the resin, 1-50 parts by weight of at least one filler selected from the group consisting of silica, alumina, zirconia and silicon nitride.

9. The adhesive tape of claim 7, wherein at least one of the heat-resistant resin layer and the B-stage cured heat-resistant resin adhesive layer comprises a heat-resistant resin and per 100 parts by weight of the resin, 0.01-30 parts by weight of at least one silane coupling agent selected from compounds represented by the following formula (I):

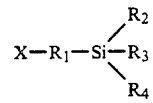

wherein X means $CH_2=CH-$ or

in which $R_5$ and $R_6$ are each $H-$ or $NH_2CH_2CH_2-$, $R_1$ denotes $-C_nH_{2n}$ in which n stands for an integer of 0-5, and $R_2$, $R_3$ and $R_4$ individually represent a group selected from the group consisting of $-CH_3$, $-OCH_3$, $-OCH_2CH_3$ and $-OCH_2CH_2CH_3$.

10. The adhesive tape of claim 7, wherein the adhesive tape is suitable for use in wire-bonding a semiconductor device.

11. The adhesive tape of claim 7, wherein the B-stage cured heat-resistant resin adhesive layer comprises a heat-resistant resin and per 100 parts by weight of the resin, 1-50 parts by weight of at least one filler selected from the group consisting of silica, alumina, zirconia and silicon nitride.

12. The adhesive tape of claim 7, wherein the B-stage cured heat-resistant resin adhesive layer comprises a heat-resistant resin and per 100 parts by weight of the resin, 0.01-30 parts by weight of at least one silane coupling agent selected form compounds represented by the following formula (I):

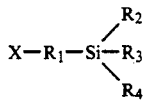

wherein X means $CH_2=CH-$ or

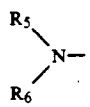

in which $R_5$ and $R_6$ are each $H-$ or $NH_2CH_2CH_2-$, $R_1$ denotes $-C_nH_{2n}$ in which n stands for an integer of 0-5, and $R_2$, $R_3$, $R_4$ individually represent a group selected from the group consisting of $-CH_3$, $-OCH_3$, $-OCH_2CH_3$ and $-OCH_2CH_2CH_3$.

13. An adhesive tape which consists essentially of a heat-resistant substrate consisting of a heat-resistant resin layer, a heat-resistant adhesive layer and a heat-resistant film, a copper foil provided on the heat-resistant resin layer of the substrate, and a B-stage cured heat-resistant resin adhesive layer and a removable protective film provided successively on the other side of the heat-resistant film of the substrate.

14. The adhesive tape of claim 13, wherein at least one of the heat-resistant resin layer, the heat-resistant adhesive layer and the B-stage cured heat-resistant adhesive layer comprises a heat-resistant resin and per 100 parts by weight of resin, 0.01-50 parts by weight of at least one filler selected from the group consisting of silica, alumina, zirconia and silicon nitride.

15. The adhesive tape of claim 13, wherein at least one of the heat-resistant resin layer, the heat-resistant adhesive layer and the B-stage cured heat-resistant resin adhesive layer comprises a heat-resistant resin and per 100 parts by weight of the resin, 0.01-30 parts by weight of at least one silane coupling agent selected from the compounds represented by the following formula (I):

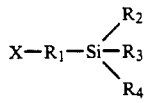

wherein X means $CH_2=CH-$ or

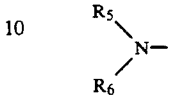

in which $R_5$ and $R_6$ are each $H-$ or $NH_2CH_2CH_2-$, $R_1$ denotes $-CnH_{2n}$ in which n stands for an integer of 0-5 and $R_2$, $R_3$ and $R_4$ individually represent a group selected from the group consisting of $-CH_3$, $-OCH_3$, $-OCH_2CH_3$ and $-OCH_2CH_2CH_3$.

16. The adhesive tape of claim 13, wherein the adhesive tape is suitable for use in wire-bonding a semiconductor device.

17. The adhesive tape of claim 13, wherein the B-stage cured heat-resistant resin adhesive layer comprises a heat-resistant resin and per 100 parts by weight of the resin, 0.01-50 parts by weight of at least one filler selected from the group consisting of silica, alumina, zirconia and silicon nitride.

18. The adhesive tape of claim 13, wherein the B-stage cured heat-resistant resin adhesive layer comprises a heat-resistant resin and per 100 parts by weight of the resin, 0.01-30 parts by weight of at least one silane coupling agent selected from compounds represented by the following formula:

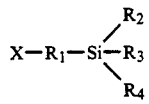

wherein X means $CH_2=CH-$ or

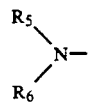

in which $R_5$ and $R_6$ are each $H-$ or $NH_2CH_2CH_2-$, $R_1$ denotes $-C_nH_{2n}$ in which n stands for an integer of 0-5, and $R_2$, $R_3$ and $R_4$ individually represent a group selected from the group consisting of $-CH_3$, $-OCH2CH3$ and $-OCH2CH2CH3$.

* * * * *